United States Patent
Suh et al.

(10) Patent No.: US 10,332,582 B2
(45) Date of Patent: Jun. 25, 2019

(54) PARTIAL REFRESH TECHNIQUE TO SAVE MEMORY REFRESH POWER

(71) Applicant: QUALCOMM Incorporated, San Diego, CA (US)

(72) Inventors: Jungwon Suh, San Diego, CA (US); Yanru Li, San Diego, CA (US); Michael Hawjing Lo, San Diego, CA (US); Dexter Tamio Chun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/667,618

(22) Filed: Aug. 2, 2017

(65) Prior Publication Data

US 2019/0043558 A1   Feb. 7, 2019

(51) Int. Cl.
  *G11C 7/00* (2006.01)
  *G11C 11/406* (2006.01)
  *G11C 7/10* (2006.01)

(52) U.S. Cl.
  CPC ...... *G11C 11/40622* (2013.01); *G11C 7/1006* (2013.01); *G11C 7/1045* (2013.01); *G11C 2211/406* (2013.01)

(58) Field of Classification Search
  CPC .......... G11C 11/40615; G11C 11/406; G11C 11/40611; G11C 11/4087; G11C 11/4096; G11C 11/40622; G11C 11/401; G11C 11/40626; G11C 11/4076; G11C 2207/2254; G11C 29/02; G11C 29/023; G11C 29/028

USPC ..... 365/222, 193, 189.07, 194, 120, 185.25, 365/189.011, 189.02, 201, 233.1, 233.11, 365/236

See application file for complete search history.

(56) References Cited

U.S. PATENT DOCUMENTS

| | | |
|---|---|---|
| 6,834,022 B2 | 12/2004 | Derner et al. |
| 7,145,828 B2 | 12/2006 | Lee et al. |
| 7,486,584 B2 | 2/2009 | Kajigaya |
| 9,418,723 B2 | 8/2016 | Chishti et al. |
| 2002/0041536 A1 | 4/2002 | Tomita |

(Continued)

OTHER PUBLICATIONS

JEDEC Standard: "Low Power Double Data Rate 4 (LPDDR4)," JESD209-4A, JEDEC Solid State Technology Association, Nov. 2015, 272 pages.

(Continued)

*Primary Examiner* — Thong Q Le
(74) *Attorney, Agent, or Firm* — Muncy, Geissler, Olds & Lowe, P.C.

(57) ABSTRACT

In a conventional memory subsystem, a memory controller issues explicit refresh commands to a DRAM memory device to maintain integrity of the data stored in the memory device when the memory device is in an auto-refresh mode. A significant amount of power may be consumed to carry out the refresh. To address this and other issues, it is proposed to allow a partial refresh in the auto-refresh mode in which the refreshing operation may be skipped for a subset of the memory cells. Through such selective refresh skipping, the power consumed for auto-refreshes may be reduced. Operating system kernels and memory drivers may be configured to determine areas of memory for which the refreshing operation can be skipped.

27 Claims, 12 Drawing Sheets

(56) References Cited

U.S. PATENT DOCUMENTS

| | | |
|---|---|---|
| 2002/0191467 A1 | 12/2002 | Matsumoto et al. |
| 2004/0240296 A1 | 12/2004 | Jeong |
| 2005/0068826 A1 | 3/2005 | Hoehler |
| 2008/0037344 A1 | 2/2008 | Kobayashi |
| 2009/0248972 A1 | 10/2009 | Ware et al. |
| 2010/0182864 A1 | 7/2010 | Ichimura |
| 2012/0026813 A1 | 2/2012 | Sato |
| 2013/0100755 A1* | 4/2013 | Youn ................ G11C 11/40615 365/222 |
| 2017/0249412 A1* | 8/2017 | Subramanian ...... G06F 17/5054 |

OTHER PUBLICATIONS

Zhang T., et al., "The Evaluation of a Novel Concurrent-Refresh-Aware DRAM System", PennState 1855, Technical Report, May 12, 2012, pp. 1-27.

International Search Report and Written Opinion—PCT/US2018/034659—ISA/EPO—dated Aug. 21, 2018.

* cited by examiner

*FIG. 3*

| BANK 0 | BANK 1 | BANK 2 | BANK 3 | BANK 4 | BANK 5 | BANK 6 | BANK 7 |
|---|---|---|---|---|---|---|---|
| Segment 7 | Segment 7 | Segment 7 | Segment 7 | Segment 7 | Segment 7 | Segment 7 | Segment 7 |
| Segment 6 | Segment 6 | Segment 6 | Segment 6 | Segment 6 | Segment 6 | Segment 6 | Segment 6 |
| Segment 5 | Segment 5 | Segment 5 | Segment 5 | Segment 5 | Segment 5 | Segment 5 | Segment 5 |
| Segment 4 | Segment 4 | Segment 4 | Segment 4 | Segment 4 | Segment 4 | Segment 4 | Segment 4 |
| Segment 3 | Segment 3 | Segment 3 | Segment 3 | Segment 3 | Segment 3 | Segment 3 | Segment 3 |
| Segment 2 | Segment 2 | Segment 2 | Segment 2 | Segment 2 | Segment 2 | Segment 2 | Segment 2 |
| Segment 1 | Segment 1 | Segment 1 | Segment 1 | Segment 1 | Segment 1 | Segment 1 | Segment 1 |
| Segment 0 | Segment 0 | Segment 0 | Segment 0 | Segment 0 | Segment 0 | Segment 0 | Segment 0 |

MRxx definition (OP: Operand)

| OP[7] | OP[6] | OP[5] | OP[4] | OP[3] | OP[2] | OP[1] | OP[0] |
|---|---|---|---|---|---|---|---|
| Reserved for Future Use | | | | | | PAR_EN | |

| Function | Register Type | Operand | Operation |
|---|---|---|---|
| PAR_EN (partial array refresh enable) | Write only | OP[1:0] | 00: PAAR disabled, PASR disabled<br>01: PAAR disabled, PASR enabled<br>10: PAAR enabled, PASR disabled<br>11: PAAR enabled, PASR enabled |

*FIG. 4*

| OP[7] | OP[6] | OP[5] | OP[4] | OP[3] | OP[2] | OP[1] | OP[0] |
|---|---|---|---|---|---|---|---|
| Segment Mask ||||||||

| Function | Segment Mask |
|---|---|
| Register Type | Write only |
| Operand | OP[7:0] |
| Data | 0B: Segment Refresh Enable<br>1B: Segment Refresh Disable |

*FIG. 5A*

| OP[7] | OP[6] | OP[5] | OP[4] | OP[3] | OP[2] | OP[1] | OP[0] |
|---|---|---|---|---|---|---|---|
| Bank Mask ||||||||

| Function | Bank Mask |
|---|---|
| Register Type | Write only |
| Operand | OP[7:0] |
| Data | 0B: Bank Refresh Enable<br>1B: Bank Refresh Disable |

PARTIAL REFRESH TECHNIQUE TO SAVE MEMORY REFRESH POWER

FIELD OF DISCLOSURE

The field of the disclosed subject matter relates to memory devices. In particular, the field of the disclosed subject matter relates to partial refresh operations in memory devices to save power.

BACKGROUND

Memory devices such as dynamic random access memories (DRAM) are widely used in computing devices, including mobile devices, to store data. To maintain data integrity, DRAMS cells are periodically refreshed. As density and speed of the DRAMs increase, the impact of the refresh operations on DRAM's overall performance and power consumption become more and more non-trivial. The refresh operation impact can be particularly significant in mobile devices since power consumption is of greater concern in such devices.

SUMMARY

This summary identifies features of some example aspects, and is not an exclusive or exhaustive description of the disclosed subject matter. Whether features or aspects are included in, or omitted from this Summary is not intended as indicative of relative importance of such features. Additional features and aspects are described, and will become apparent to persons skilled in the art upon reading the following detailed description and viewing the drawings that form a part thereof.

An exemplary apparatus is disclosed. The apparatus may comprise a memory device, and the memory device may comprise a plurality of memory cells and a partial array refresh mask register. When the memory device is in an auto-refresh mode and the partial array auto-refresh is enabled, a portion of the plurality of memory cells may be masked from being refreshed based on the partial array refresh mask register.

An exemplary apparatus is disclosed. The apparatus may comprise a system-on-chip and a memory device configured to communicate with each other over a link. The system-on-chip may be configured to provide commands to the memory device over the link. The memory device maybe configured to be in a self-refresh mode or in an auto-refresh mode. The memory device may comprise a plurality of memory cells. The memory device may also comprise a partial array refresh mask register. When the memory device is in the self-refresh mode and a partial array self-refresh is enabled, the memory device may refresh a subset of the memory cells selected in accordance with the partial array refresh mask register without receiving refresh commands from the system-on-chip. When the memory device is in the auto-refresh mode and a partial array auto-refresh is enabled, the memory device may refresh the subset of the memory cells selected in accordance with the partial array refresh mask register upon receiving the refresh command from the system-on-chip.

An exemplary method for reducing power consumption in an apparatus of a computing system is disclosed. The apparatus may comprise a system-on-chip and a memory device configured to communicate with each other over a link. The system-on-chip may be configured to provide commands to the memory device over the link. The memory device may comprise a plurality of memory cells. The memory device may also comprise a plurality of mode registers configured to implement a partial array refresh enable register and a partial array refresh mask register. The partial array refresh enable register may comprise a plurality of enable bits including a partial array self-refresh enable bit and a partial array auto-refresh enable bit. The partial array self-refresh enable bit when set may indicate that partial array self-refresh is enabled, and the partial array auto-refresh enable bit when set may indicate that partial array auto-refresh is enabled. In the method, the system-on-chip may issue, for each mode register used to implement the partial array refresh enable register, a mode register write command with a corresponding mode value to the memory device so as to set the partial array auto-refresh enable bit of the partial array refresh enable register. The system-on-chip may also issue, for each mode register used to implement the partial array refresh mask register, the mode register write command with the corresponding mode value to the memory device so as to cause a mask value to be written to the partial array refresh mask register in which the mask value corresponds to the refresh skip region. The system-on-chip may issue a refresh command to the memory device. If the partial array auto-refresh enable bit is set when the refresh command is issued, the memory device may skip refreshing of the refresh skip region based on the partial array refresh mask register.

An exemplary apparatus is disclosed. The apparatus may comprise a system-on-chip and a memory device configured to communicate with each other over a link. The system-on-chip may be configured to provide commands to the memory device over the link. The memory device maybe configured to be in a self-refresh mode or in an auto-refresh mode. The memory device may comprise and a plurality of memory cells, a partial array refresh mask register, and means for refreshing. When the memory device is in the self-refresh mode and a partial array self-refresh is enabled, the means for refreshing may refresh a subset of the memory cells selected in accordance with the partial array refresh mask register without receiving refresh commands from the system-on-chip. When the memory device is in the auto-refresh mode and a partial array auto-refresh is enabled, the means for refreshing may refresh the subset of the memory cells selected in accordance with the partial array refresh mask register upon receiving the refresh command from the system-on-chip.

BRIEF DESCRIPTION OF THE DRAWINGS

The accompanying drawings are presented to aid in the description of examples of one or more aspects of the disclosed subject matter and are provided solely for illustration of the examples and not limitation thereof:

FIG. 3 illustrates an example partitioning of a plurality of memory cells of a memory device;

FIG. 4 illustrates an example of a mode register used to implement a partial array refresh enable register;

FIGS. 5A and 5B illustrate examples of mode registers used to implement a partial array mask;

FIGS. 6A-6D illustrate different scenarios in which refresh operations are performed and skipped based on masking when a refresh-all-banks command is issued when partial array auto-refresh is enabled;

DETAILED DESCRIPTION

Figure 1:
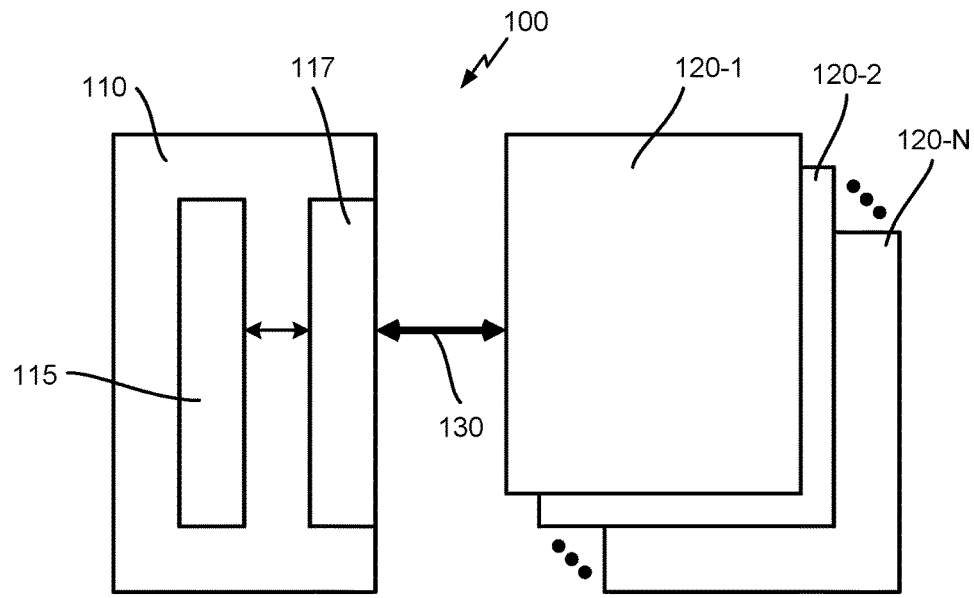
FIG. 1 illustrates an example of a memory subsystem.

Aspects of the subject matter are provided in the following description and related drawings directed to specific examples of the disclosed subject matter. Alternates may be devised without departing from the scope of the disclosed subject matter. Additionally, well-known elements will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments of the disclosed subject matter include the discussed feature, advantage or mode of operation.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, processes, operations, elements, and/or components, but do not preclude the presence or addition of one or more other features, integers, processes, operations, elements, components, and/or groups thereof.

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects may be embodied in a number of different forms, all of which have been contemplated to be within the scope of the claimed subject matter. In addition, for each of the examples described herein, the corresponding form of any such examples may be described herein as, for example, "logic configured to" perform the described action.

A cell of a DRAM typically includes an access transistor and a capacitor. Data is stored as an electrically charge in the capacitor. Over time, the charge in the capacitor leaks. To retain the data in the leaky capacitor, periodic refreshes are performed which consume power. In mobile devices, power consumed to perform refreshes can be of a significant concern.

DRAM devices including mobile DRAM devices usually support two refresh methods—self-refresh (SR) and auto-refresh (AR). SR is used when the DRAM device is in idle or low power state. In the JEDEC (Joint Electron Device Engineering Council) LPDDR4 (Low Power Double Data Rate 4) standard document JESD209-4A, which is hereby incorporated by reference in its entirety, a DRAM device enters and exits the SR mode when it receives self-refresh enter (SRE) and self-refresh exit (SRX) commands from a memory controller. The DRAM device includes a built-in timer which allows it to accommodate the self-refresh operation. When in the SR mode, the SDRAM device can retain data without receiving a refresh command from the memory controller.

To reduce the self-refresh current ("IDD6" in JEDEC), and hence reduce the self-refresh power consumed, a mobile DRAM device provides a partial array self-refresh (PASR) function which executes a partial array refresh (PAR) during the SR mode. In PASR, the memory controller programs the mobile DRAM device to refresh only a portion of the memory through a PASR mask.

When the DRAM device is an active state, auto-refresh is used to retain the DRAM cell data. In the AR mode, the memory controller provides an explicit refresh REF command to the mobile DRAM device. To reduce the auto-refresh current ("IDD5" in JEDEC), existing solutions focus on controlling the auto refresh rate tREFI based on temperature. As an illustration, as the device's temperature decreases, the auto refresh rate may also slow down, for example, to half the normal refresh rate or 2*tREFI. In effect, the overall IDD5 consumption is reduced in conventional solutions by lengthening the time in between the refreshes, e.g., by slowing down the rate of the REF commands being issued.

However, in a non-limiting aspect, it is proposed to allow partial array refreshes even when the memory device is in the active state. To state it another way, a partial array auto-refresh (PAAR) can be enabled in which the refresh is skipped for some of the memory cells during the refresh operation. In this way, the auto-refresh current can be reduced.

An example of a memory subsystem is illustrated in FIG. 1. The memory subsystem 100 may include a system-on-chip (SOC) 110 and one or more memory devices 120 communicating over a link 130. In reality, the link 130 may comprise a plurality of signal lines including lines to transmit unidirectional signals from the SOC 110 to the memory devices 120 (e.g., clock (CK), chip select (CS), command & address (CA), etc.) and bidirectional directional signals (data (DQ), data strobe (DQS), etc.).

The SOC 110 may include a memory controller 115 and a PHY block 117. The SOC 110 and the memory devices 120 may be in communication with each other over the link 130. In particular, the memory controller 115 may control the memory devices 120 by exchanging signals to write data to and read data from the memory cells of the memory devices 120.

Figure 2:
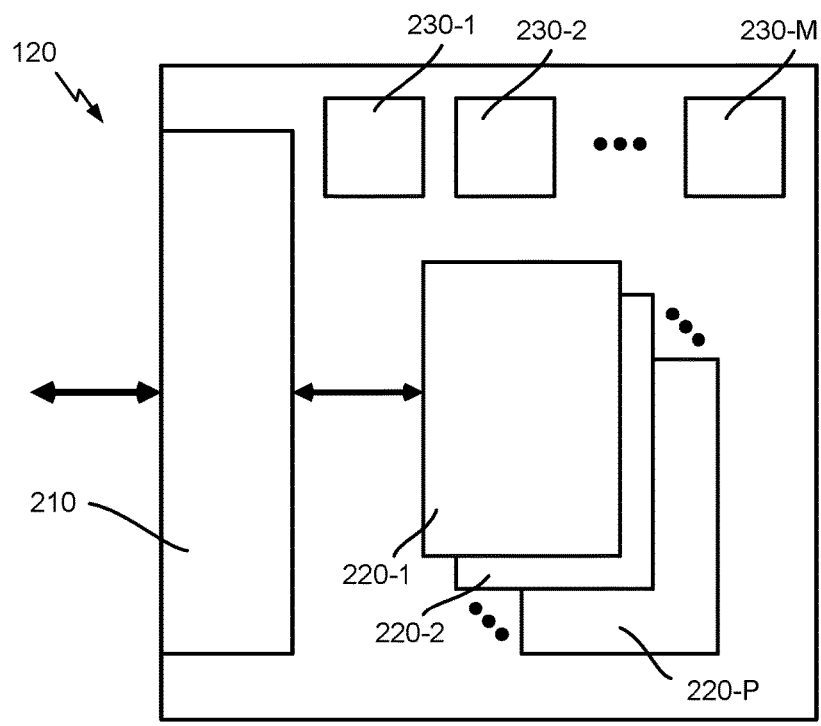
FIG. 2 illustrates an example of a memory device.

As seen in the figure, there may be N memory devices 120-1 . . . 120-N, where N may be any integer greater than zero. An example of a memory device 120 is illustrated in FIG. 2. As seen, the memory device 120 may include an input/output (I/O) circuit 210 configured to interface with the memory controller 115. The I/O circuit 210 may be an example of means for interfacing. The memory controller 115 may be considered to be external to the memory device 120. The I/O circuit 210 may also be configured to write data to and read data from a plurality of memory cells. The memory cells of the memory device 120 may be DRAM cells which store data as charges on capacitors.

In an aspect, the plurality of memory cells may be partitioned into a plurality of memory banks 220 or simply banks 220. As seen, there may be P banks 220-1 . . . 220-P, where P may be any integer greater than zero. The memory cells in each bank 220 may be further partitioned into a plurality of blocks or segments. Note that the memory cells within a bank may be segmented in various ways including by row addresses, by column address, or a combination there of. FIG. 3 illustrates an example partitioning of the plurality of memory cells of the memory device 120. In this figure, it is assumed that there are eight banks, i.e, P=8. Also, within each bank, it is assumed that there are eight segments per bank. Of course, this is merely an example, and is not a limitation.

Referring back to FIG. 2, the memory device 120 may further include a plurality of mode registers (MR) 230. The mode registers 230 may define the behavior of the memory device 120. As seen, there may be M mode registers 230-1 . . . 230-M, where M may be any integer greater than zero. Each mode register 230 may be a write type, a read type, or a read/write type. The SOC 110 (e.g., the memory controller 115) may issue a mode register write (MRW) command to designate a particular write or read/write type mode register along with a mode value, and the I/O circuit 210 may write the received mode value to the designated mode register. The memory controller 115 may also issue a mode register read (MRR) command to designate a particular read or read/write type mode register, and the I/O circuit 210 may read from the designated mode register and provide the read value to the memory controller 115.

When the memory cells of the memory device 120 are DRAM cells, periodic refreshes are performed to maintain integrity of data stored in the cells. The memory device 120 may be configured to be in a self-refresh (SR) mode or in an auto-refresh (AR) mode. In an aspect, the memory device 120 may enter and exit the SR mode upon respectively receiving the self-refresh-enter (SRE) and the self-refresh-exit (SRX) commands from the memory controller 115.

As indicated, when the memory device 120 is in the SR mode, the memory device 120 (e.g., the I/O circuit 210 or some other component) may be configured to refresh the memory cells without receiving refresh (REF) commands from the memory controller 115. In this mode, the memory device 120 may generate the necessary refresh pulses through a built-in timer (not shown), and thereby negate the need for the memory controller 115 to issue explicit REF commands. The SR mode may be considered as a low power refresh mode since the SOC 110 can be put into an idle state to reduce power consumption.

On the other hand, when the memory device 120 is in the active state, i.e., when it is in the AR mode, the memory controller 115 may control the refresh operation through issuing the REF commands. The I/O circuit 210 may be configured to refresh the memory cells upon receiving the REF command from the memory controller 115. To reduce the consumption of the auto-refresh current (e.g., IDD5), it is proposed to enable the memory device 120 to refresh a subset—less than all—of the memory cells when the memory controller 115 issues the REF command. That is, it is proposed allow partial array refresh in which the refresh operation is skipped for a non-zero number of the memory cells.

Masking may be used to specify the portions of the memory cells for which the refresh operations are to be skipped and other portions for which the refresh operations are to be performed. To enable refresh masking, the memory device 120 may include a partial array refresh enable register and a partial array refresh mask register. The bits of the PAR enable register may indicate whether one, both, or none of the partial array auto-refresh (PAAR) and the partial array self-refresh (PAAR) are enabled. A mask value in the PAR mask register may indicate the portions of the memory cells in which the refresh operations are to be skipped as well as portions in which the refresh operations are to be performed.

The PAR enable register may comprise a plurality of enable bits including a PAAR enable bit and a PASR enable bit. The PAAR enable bit, when set or unset, may indicate that the PAAR is enabled or disabled. Similarly, the PASR enable bit, when set or unset, may indicate that the PASR is enabled or disabled. One or more of the mode registers 230 may be used to implement the PAR enable register. For each mode register 230 used to implement the PAR enable register, the memory controller 115 may issue an MRW command along with a corresponding mode value. The I/O circuit 210 in turn may write the corresponding mode value to that mode register 230. In this way, the PAAR enable bit may be set or unset, and the PASR enable bit may be set or unset.

FIG. 4 illustrates an example of a mode register 230 used to implement the PAR enable register. In this example, it is assumed that the mode register 230 for the PAR enable register comprises eight operand (OP) bits in which bits OP[1] and OP[0] respectively are the PAAR enable bit and the PASR enable bit. The PAAR enable bit, when set or unset, indicates that the PAAR is enabled or disabled. Similarly, the PASR enable bit, when set or unset, indicates that the PASR is enabled or disabled. The value represented by the bits OP[1:0] of the PAR enable register may be referred to as the refresh enable value.

Different one or more of the mode registers 230 may be used to implement the PAR mask register. The PAR mask register may include a plurality of segment mask bits, a plurality of bank mask bits, or both. For each mode register 230 used to implement the PAR mask register, the memory controller 115 may issue an MRW command along with a corresponding mode value. In turn, the I/O circuit 210 may write the corresponding mode value to that mode register 230. In this way, the mask value may be written to the PAR mask register.

FIGS. 5A and 5B illustrate examples of the mode registers 230 used to implement the PAR mask register. In this example, the assumption is that the memory cells are partitioned into eight banks and eight segments per bank as illustrated in FIG. 3. Therefore, in this instance, the PAR mask register may include both the segment mask bits and the bank mask bits. The eight segment mask bits may be implemented using one of the mode registers 230 as illustrated in FIG. 5A. Each OP bit in FIG. 5A may correspond to a segment of a bank, and may indicate whether the refresh is enabled or disabled for the corresponding segment. The eight bank mask bits may be implemented using another one of the mode registers 230 as illustrated in FIG. 5B. Each OP bit in FIG. 5B may correspond to a bank, and may indicate whether the refresh is enabled or disabled for the corresponding bank.

Of course, this is merely an example and should not be taken as limiting. If the memory cells are partitioned in segments only or in banks only, then a single mode register 230 may be sufficient to implement the PAR mask register. If the memory cells are partitioned in further ways, then more mode registers 230 may be necessary for the PAR mask register implementation.

Referring back to FIGS. 5A and 5B, when the memory device 120 is in the AR mode and the PAAR is enabled (i.e., the PAAR enable bit of the PAR enable register is set) the memory device 120 may refresh a subset of the memory cells selected in accordance with the PAR mask register upon receiving the REF command from the memory controller 115. The REF command can be a refresh-all-bank (REFab) command or a refresh-per-bank (REFpb) command. Different refresh operations may be carried out depending on the type of the REF command (REFab or REFpb) and on whether the PAR mask includes the segment and/or bank mask bits.

In first through fourth scenarios illustrated in FIGS. 6A-6D, it may be assumed that the memory device 120 is in the AR mode, the PAAR is enabled, and the REF command is the refresh-all-banks REFab command. Also, if the segment masking is applied, assume that segment mask bits indicate that the refreshing is disabled for segments 4 and 6. Further, if the bank masking is applied, assume that the bank mask bits indicate that the refreshing is disabled for banks 3, 5 and 6.

Figure 6A:
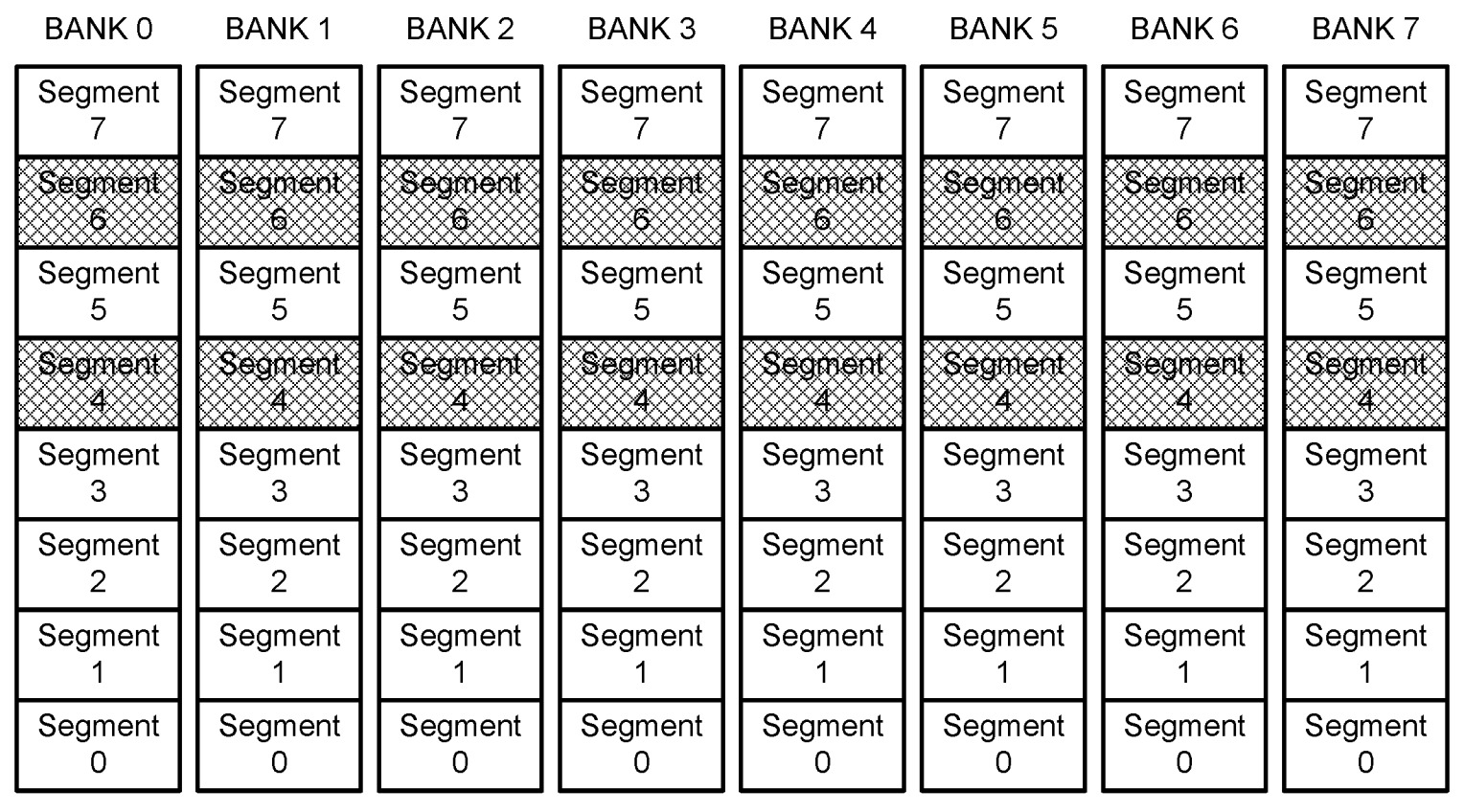

In the first scenario, it may be assumed that only the segment masking is applied. This may be because the PAAR mask register only includes the segment mask bits or the bank masking is turned off. In this first scenario, the memory device 120 may, for each bank, skip the refreshing of each segment whose corresponding segment mask bit indicates that the refreshing is disabled for that segment. An example is illustrated in FIG. 6A in which the shaded segments represent the segments for which the refresh has been skipped. It is seen that segments 4 and 6 for all for all eight banks are shaded.

Figure 6B:
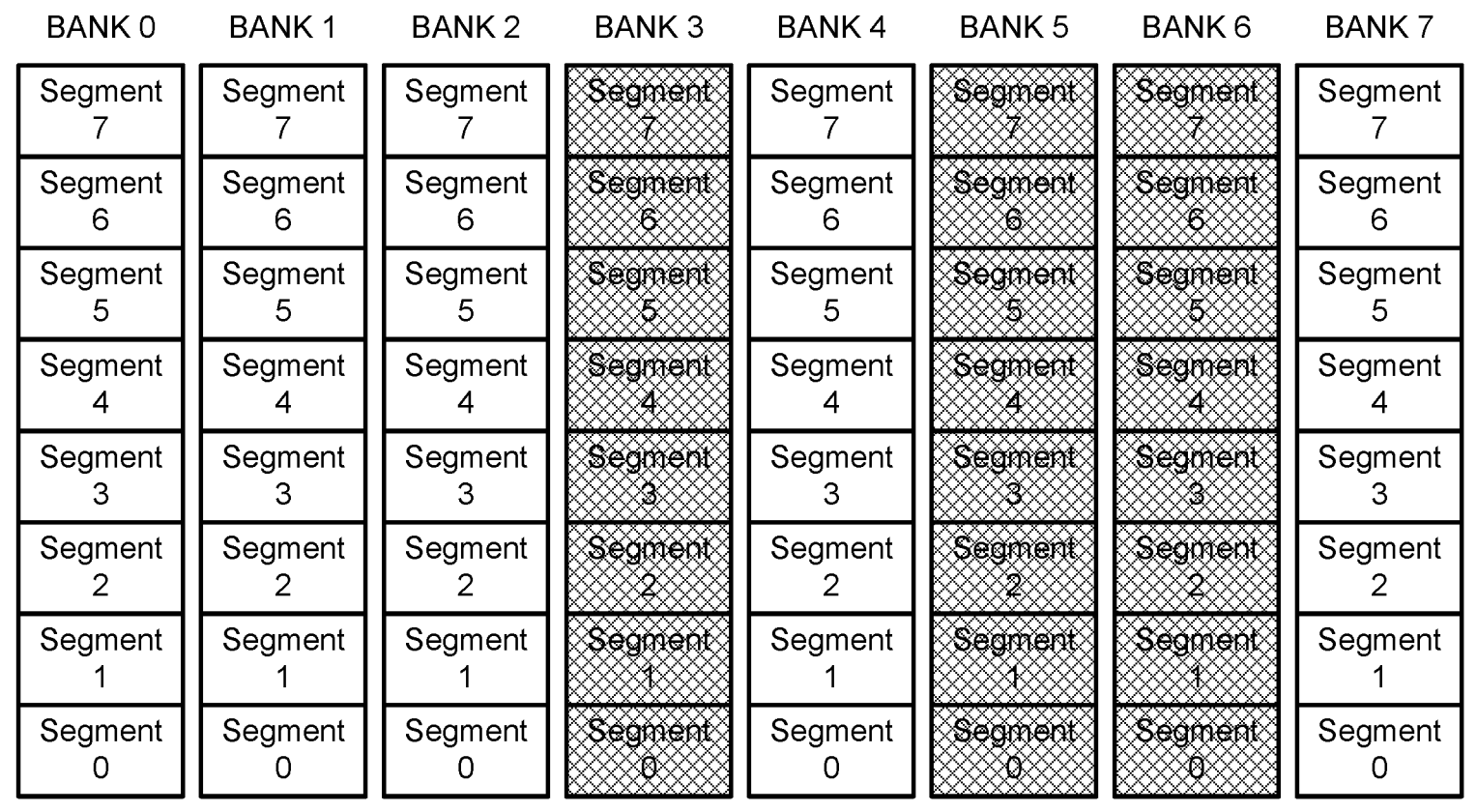

In the second scenario, it may be assumed that only the bank masking is applied. This may be because the PAAR mask register only includes the banks mask bits or the segment masking is turned off. In the second scenario, the memory device 120 may, for each bank, skip refreshing that bank when the corresponding bank mask bit indicates that the refreshing is disabled for that bank. An example is illustrated in FIG. 6B in which all segments of banks 3, 5 and 6 are shaded.

Figure 6C:
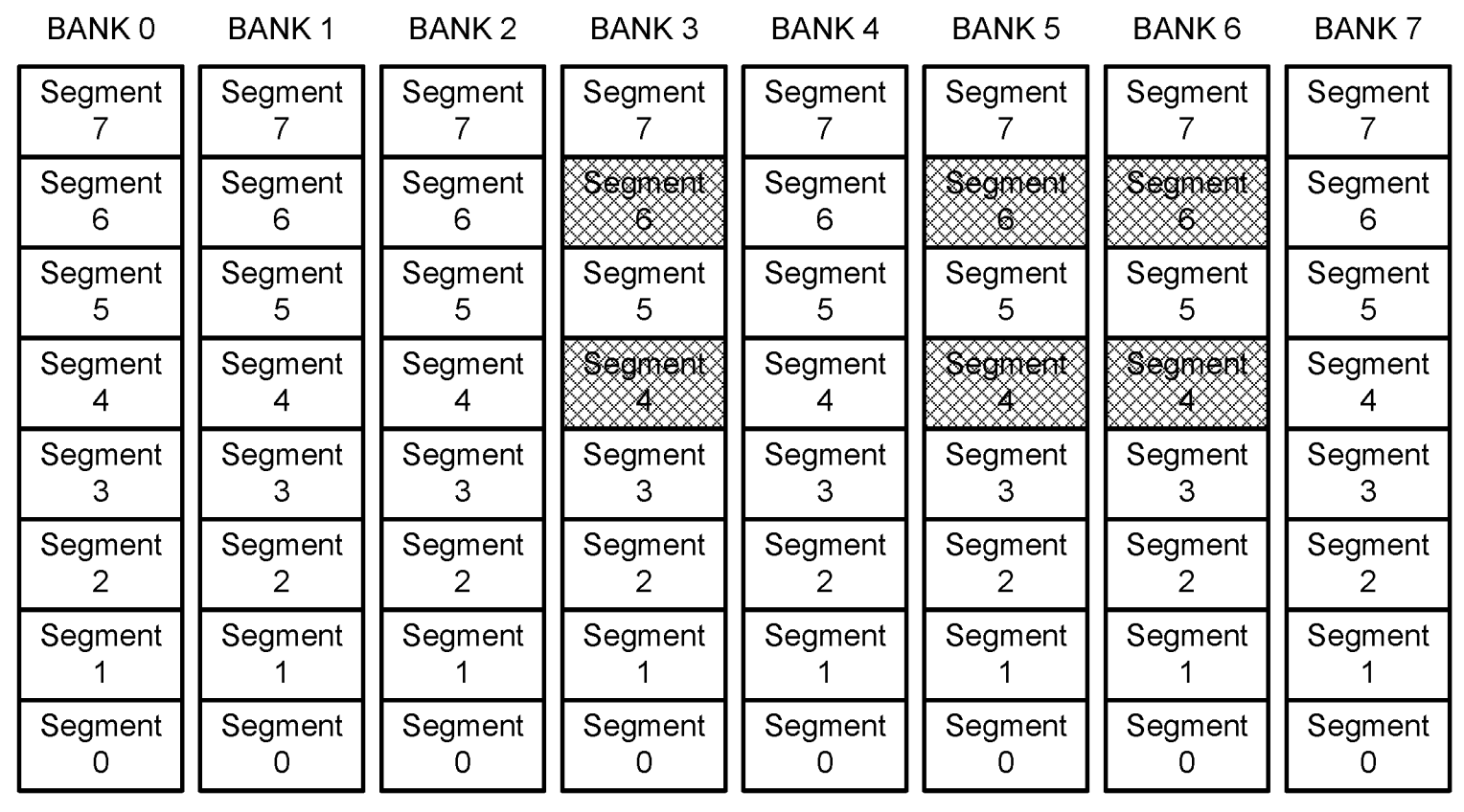

In the third scenario, it may be assumed that both the bank and segment masking are applied. In the third scenario, the refresh operation may be skipped for a segment of a bank when both of its corresponding bank and segments mask bits indicate that the refresh is disabled. An example is illustrated in FIG. 6C. Note that if the refresh is skipped for a segment only when both of its bank and segment mask bits indicate that the refresh is disabled, then the first scenario of FIG. 6A may be recreated by enabling all bank mask bits while disabling the segment mask bits of segments 4 and 6, and the second scenario of FIG. 6B may be recreated by enabling all segment mask bits while disabling the bank mask bits of banks 3, 5 and 6.

Figure 6D:
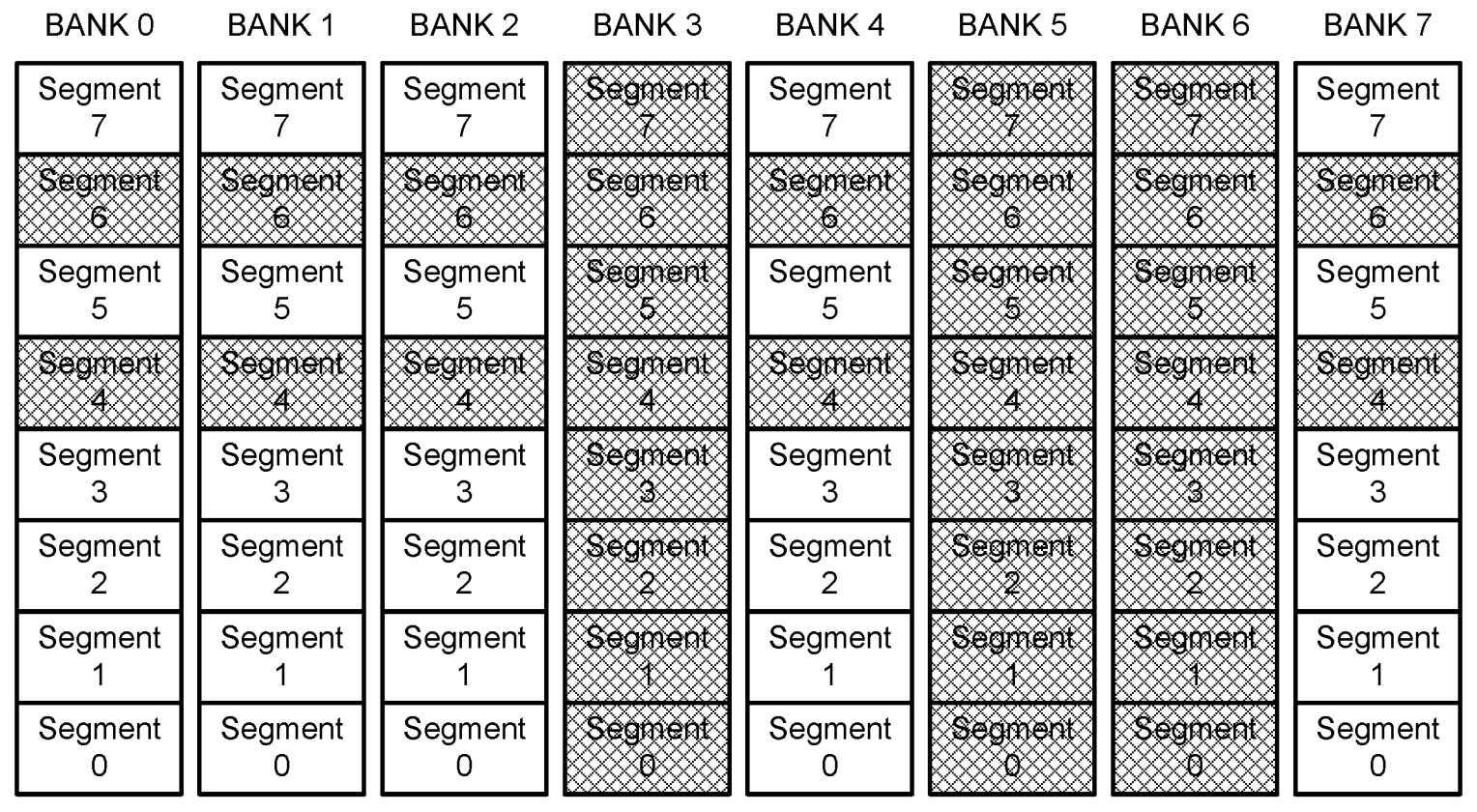

In the fourth scenario, it may also be assumed that both the bank and segment masking are applied. But in the fourth scenario, the refresh operation may be skipped for a segment of a bank when either of its corresponding bank mask bit or its corresponding segment mask bit indicates that the refresh is disabled. An example is illustrated in FIG. 6D. Note that if the refresh is skipped for a segment of a bank when either of its bank or its segment mask bit indicates that the refresh is disabled, then the first scenario of FIG. 6A may be recreated by disabling all bank mask bits while disabling the segment mask bits of segments 4 and 6, and the second scenario of FIG. 6B may be recreated by disabling all segment mask bits while disabling the bank mask bits of banks 3, 5 and 6.

Figure 7A:
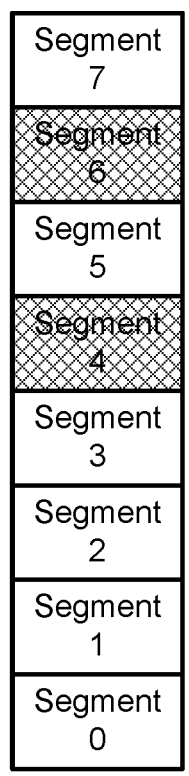
FIGS. 7A and 7B illustrate different scenarios in which refresh operations are performed and skipped based on masking when a refresh-per-bank command is issued when partial array auto-refresh is enabled.
Figure 7B:
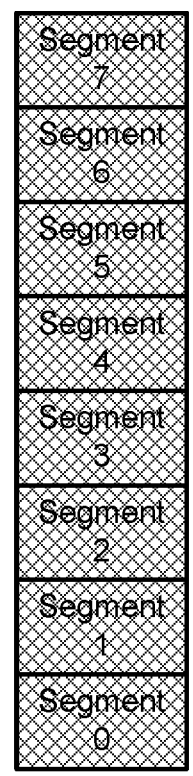

In fifth and sixth scenarios illustrated in FIGS. 7A-7B, it may be assumed that the memory device 120 is in the AR mode, the PAAR is enabled, and the REF command is the refresh-per-bank REFpb command (as opposed to the REFab command in the scenarios of FIGS. 6A-6D). If the segment masking is applied, assume that segment mask bits indicate that the refreshing is disabled for segments 4 and 6. If the bank masking is applied, assume that the bank mask bits indicate that the refreshing is disabled for banks 3, 5 and 6. In addition, assume that bank 3 is the current bank for which the REFpb command applies.

In the fifth scenario, like the first scenario, it may be assumed that only the segment masking is applied. In this fifth scenario, the memory device 120 may skip the refreshing of each segment of the current bank—bank 3—whose corresponding segment mask bit indicates that the refresh is disabled. An example is illustrated in FIG. 7A. As seen, the refresh operations for segments 4 and 6 of bank 3 are skipped. When only the segment masking is applied, then by stepping through eight REFpb commands, results similar to FIG. 6A may be achieved.

In the sixth scenario, like the second scenario, it may be assumed that only the bank masking is applied. In the sixth scenario, the memory device 120 may skip refreshing of the current bank in its entirety if the corresponding bank mask bit indicates the refresh is disabled. An example is illustrated in FIG. 7B. As seen, the refresh operations are skipped for all segments of bank 3. When only the bank masking is applied, then by stepping through eight REFpb commands, results similar to FIG. 6B may be achieved.

While not specifically illustrated, both the bank and the segments mask bits may be applied for the REFpb command In one scenario, assume that the refresh is skipped for a segment of a bank only when both of its bank and segment mask bits indicate that the refresh is disabled. In this scenario, the segment masking may be applied to skip refreshing of selected segments (e.g., segments 4 and 6) if the refresh is disabled for the current bank (e.g., bank 3). On the other hand, if the refresh is enabled for the current bank, the entirety of the current bank may be refreshed regardless of the segment mask, i.e., no skipping of refresh for any segment of the current bank (not shown). In this instance, by stepping through eight REFpb commands, results similar to FIG. 6C may be achieved.

In another scenario, assume that the refresh is skipped for a segment of a bank when either of its bank or segment mask bit indicates that the refresh is disabled. In this scenario, the segment masking may be applied to skip refreshing of selected segments (e.g., segments 4 and 6) regardless of whether the refresh is enabled or disabled for the current bank (e.g., bank 3). In this instance, by stepping through eight REFpb commands, results similar to FIG. 6D may be achieved.

In an aspect, the same PAR mask register, i.e., the same one or more mode registers 230, may be used when the memory device 120 is in the SR mode. While in the SR mode, the memory device 120 may internally refresh the memory cells without the need to receive explicit REF commands from the memory controller 115. If the PASR is enabled (e.g., the PASR enable bit of the PAR enable register is set) while in the SR mode, the memory device 120 may refresh the subset of the memory cells (e.g., selected banks and/or segments) in accordance with the PAR mask register.

The memory controller 115 may issue the MRW commands for the PAR enable register, and the I/O circuit 210 may write the refresh enable value in the PAR enable register to set the PASR enable bit. The memory controller 115 may also issue the MRW commands for the PAR mask register, and the I/O circuit 210 may write the mask value in the PAR mask register. The memory controller 115 may issue the MRW command(s) prior to commanding the mobile device 120 to enter the SR mode.

While in the SR mode, if the PAR mask register only includes the segment mask bits or the bank masking is turned off, the memory device 120 may, for each bank, skip the refreshing of each segment whose corresponding segment mask bit indicates that the refreshing is disabled for that segment. This is similar to the first scenario illustrated in FIG. 6A. If the PAR mask register only includes the bank mask bits or the segment masking is turned off, the memory device 120 may, for each bank, skip the refreshing of that bank when the corresponding bank mask bit indicates that the refresh is disabled for that bank. This is similar to the second scenario illustrated in FIG. 6B.

If the PAR mask register includes both the bank and mask bits, the memory device 120 may skip the refresh operations for a segment of a bank when both of its corresponding bank and segments mask bits indicate that the refresh is disabled. This is similar to the third scenario illustrated in FIG. 6C. Alternatively, the refresh operation may be skipped for a segment of a bank when either of its corresponding bank mask bit or its corresponding segment mask bit indicates that the refresh is disabled. This is similar to the third scenario illustrated in FIG. 6D.

Figure 8A:
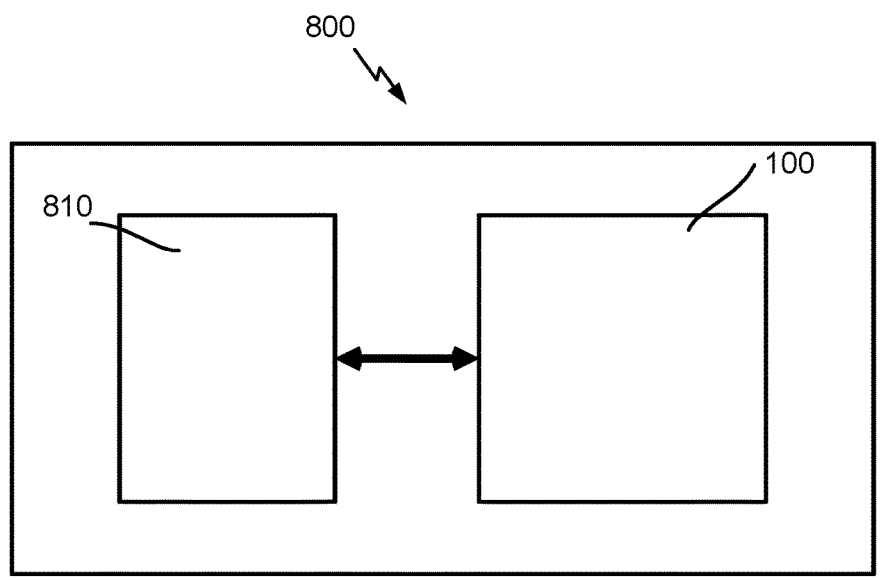
FIGS. 8A and 8B respectively illustrate hardware and hierarchical arrangement of an example computing system.

FIG. 8A illustrates an example block diagram of a computing system 800 which may include a processor 810 and a memory subsystem 100. For simplicity, other components such as input devices (e.g., keyboards, touch pads), output devices (e.g., displays), and non-volatile storage (e.g., flash, disks) are not shown in FIG. 8A. Also, the computing system 800 may include one or more processing units (e.g., CPUs), which are collectively represented by the processor 810. The memory subsystem 100 has been described in detail above. As seen, the processor 810 and the memory subsystem 100 may communicate with each other.

Figure 8B:
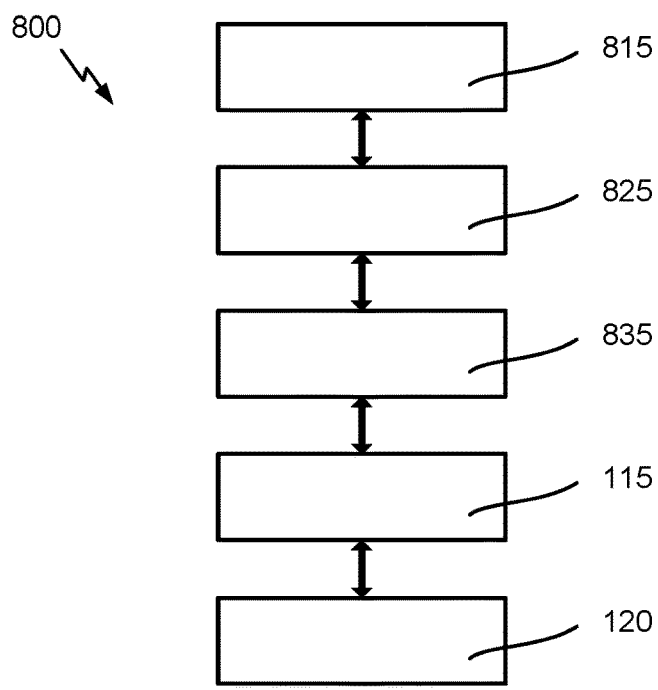

FIG. 8A illustrates an example of a hardware makeup of the computing system 800. FIG. 8B illustrates an example of a hierarchical arrangement of the same computing system 800. The computing system 800 may comprise an application 815, a high level operating system (HLOS) kernel 825, a memory driver 835, the memory controller 115, and the memory device 120, which may be hierarchically arranged in which the application 815 is at the top and the memory device 120 is at the bottom of the hierarchy. Recall that there can be multiple memory devices 120 controlled by the memory controller 115. But for simplicity of description, one memory device 120 is shown.

The memory controller 115 and the memory device 120 may be largely or even exclusively hardware. The application 815, the HLOS kernel 825, and the memory driver 835 may be a combination of hardware and software. For example, the processor 810 may execute instructions of the application 815, the HLOS kernel 825, and the memory driver 835. As seen in FIG. 8, the memory controller 115 may be in communication with the memory driver 835.

In an aspect, it is proposed that the higher level components—the application 815, the HLOS kernel and the memory driver 835—utilize the PAAR feature of the memory devices 120 to save power consumption. At boot up, the memory driver 835 may save attributes of the memory device 120 into a RAM partition table in which the whole of the memory cells of the memory device 120 are divided into regions. The RAM partition table may be readable. The HLOS kernel may generate a memory topology including power attributes, performance attributes, and group physical addresses based on the RAM partition.

A user interface may be provided to allow a user of the computing system 800 to configure the conditions upon which a power saving mode is triggered. For example, the power saving mode can be triggered based on a threshold battery level. Alternatively or in addition thereto, the power saving mode may be triggered when the computing system has been at low activity for a threshold amount of time. Multiple thresholds can be defined for different levels of active power savings.

Figure 9:
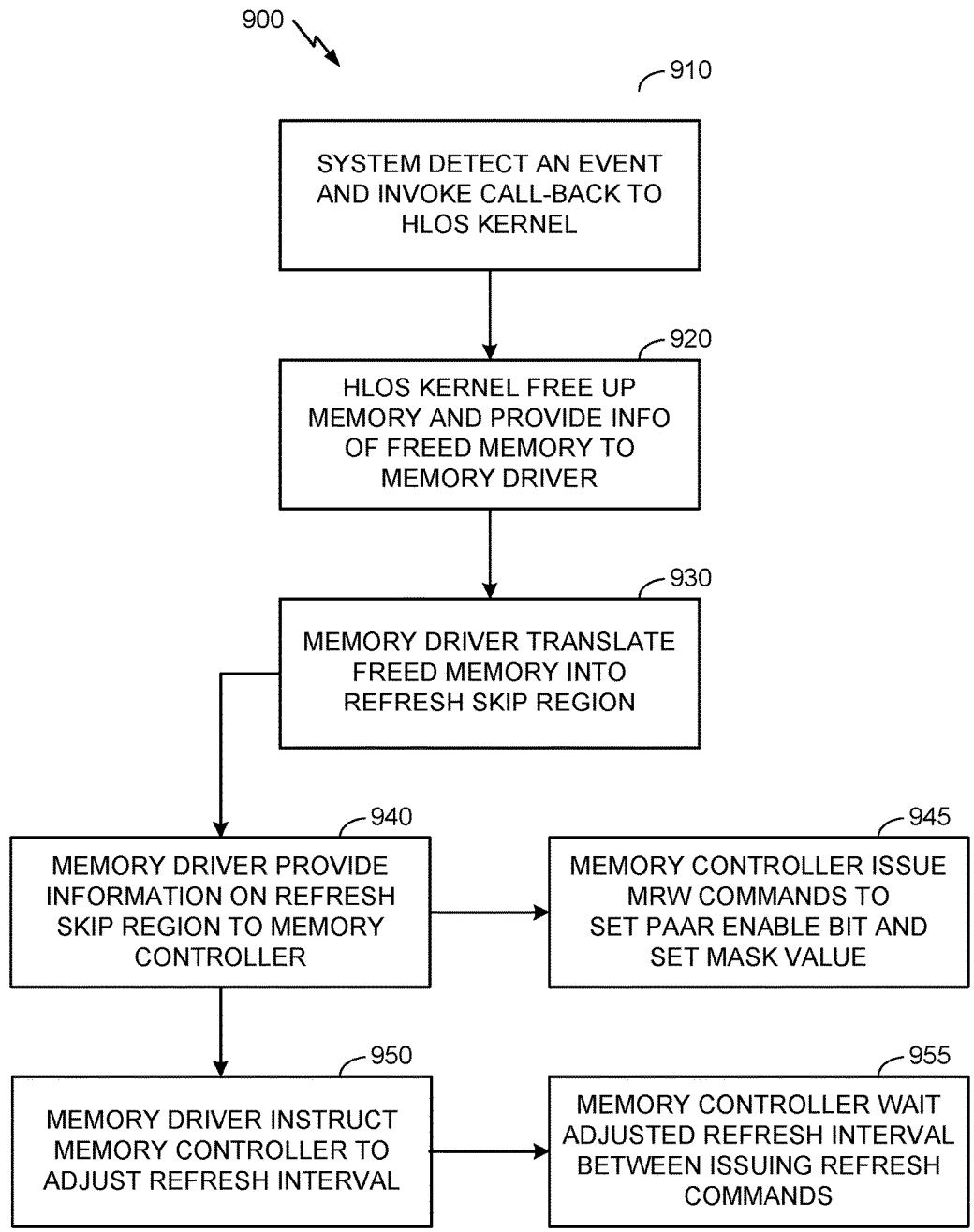
FIG. 9 illustrates an example runtime interaction among components of a computing system.

FIG. 9 illustrates an example runtime interaction among the components of the computing system 800. In block 910, an application 815 such as a system event-handler may detect an event and invoke a call-back to the HLOS kernel 825. For example, a user may have exited a user application running on the computing system 800, and the user application data may have been saved to a non-volatile storage. In this instance, the user application data need not be maintained in the memory device 120. In block 920, the HLOS kernel 825 may free up a memory region of the user application data and notify the memory driver 835 of the freed memory region.

In block 930, the memory driver 835 may translate the freed memory region into a refresh skip region, in which the refresh skip region comprises one or more portions of the memory cells of the memory device 120 that do not require refreshing. In block 940, the memory driver 835 may provide information on the refresh skip region to the memory controller 115. In block 945, the memory controller 115 may respond by issuing the MRW commands to the memory device 120 to set the PAAR enable bit of the PAR enable register, and to write a mask value corresponding to the refresh skip region to the PAR mask register.

In block 950, the memory driver 835 may instruct the memory controller 115 to adjust a refresh interval, e.g., tREFI, based on the freed memory region. For example, when refreshing is skipped for a non-zero portion of the memory cells, less power is consumed, and the memory device 120 can run cooler. Therefore, it may be safe to slow the refreshing rate. In block 955, the memory controller 115 may respond by waiting at least the adjusted refresh interval after issuing one REF command and before issuing another REF command to the memory device 120.

Figure 10:
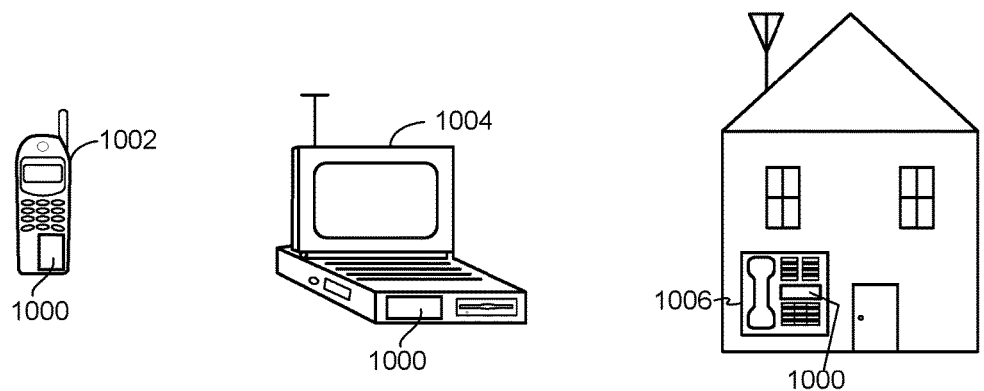
FIG. 10 illustrates examples of devices with a memory subsystem integrated therein.

FIG. 10 illustrates various electronic devices that may be integrated with any of the aforementioned memory subsystem 100. For example, a mobile phone device 1002, a laptop computer device 1004, a terminal device 1006 as well as wearable devices, portable systems, that require small form factor, extreme low profile, may include a device/package 1000 that incorporates the memory subsystem 100 as described herein. The device/package 1000 may be, for example, any of the integrated circuits, dies, integrated devices, integrated device packages, integrated circuit devices, device packages, integrated circuit (IC) packages, package-on-package devices, system in package devices described herein. The devices 1002, 1004, 1006 illustrated in FIG. 10 are merely exemplary. Other electronic devices may also feature the device/package 1000 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithms described in connection with the examples disclosed herein may be implemented as electronic hardware, computer software, or combinations of both. To clearly illustrate this interchangeability of hardware and software, various illustrative components, blocks, modules, circuits, and methods have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled with the processor such that the processor can read information from, and write information to, the storage medium. In the alternative, the storage medium may be integral to the processor.

Accordingly, an aspect can include a computer readable media embodying a method of forming a semiconductor device. Accordingly, the scope of the disclosed subject matter is not limited to illustrated examples and any means for performing the functionality described herein are included.

While the foregoing disclosure shows illustrative examples, it should be noted that various changes and modifications could be made herein without departing from the scope of the disclosed subject matter as defined by the appended claims. The functions, processes and/or actions of the method claims in accordance with the examples described herein need not be performed in any particular order. Furthermore, although elements of the disclosed subject matter may be described or claimed in the singular, the plural is contemplated unless limitation to the singular is explicitly stated.

What is claimed is:

1. An apparatus, comprising:
    a memory device, comprising:
        a plurality of memory cells; and
        a partial array refresh (PAR) mask register,
        wherein when a partial array auto-refresh (PAAR) is enabled, the memory device is configured to mask a portion of the plurality of memory cells from being refreshed based on the PAR mask register upon the memory device receiving a refresh (REF) command.

2. The apparatus of claim 1, further comprising a system-on-chip (SOC) configured to provide commands to the memory device over a link.

3. The apparatus of claim 2,
    wherein the apparatus comprises a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and
    wherein the device incorporates the memory device and the SoC configured to communicate with each other over the link.

4. The apparatus of claim 3, wherein the REF command comprises a refresh-per-bank command or a refresh-all-banks command.

5. The apparatus of claim 3,
    wherein the memory device further comprises an input/output (I/O) circuit configured to interface with the SOC over the link, and write data to and read data from the plurality of memory cells; and
    wherein memory device is configured to refresh a subset of the memory cells selected in accordance with the PAR mask register without the I/O circuit receiving the REF commands from the SOC when the memory device is in a self-refresh mode and a partial array self-refresh (PASR) and the PARR are enabled, and
    wherein the memory device is configured to refresh the subset of the memory cells selected in accordance with the PAR mask register upon the I/O circuit receiving the REF command from the SOC when the PAAR is enabled.

6. The apparatus of claim 5,
    wherein the plurality of memory cells is partitioned into a plurality of banks, each bank comprising a plurality of segments,
    wherein the PAR mask register comprises a plurality of segment mask bits, each segment mask bit corresponding to a segment indicating whether a refresh is enabled or disabled for the corresponding segment, and
    wherein when the PAAR is enabled and the REF command is a refresh-per-bank command, the memory device is configured to skip refreshing of each segment whose corresponding segment mask bit indicates that the refresh is disabled.

7. The apparatus of claim 5,
    wherein the plurality of memory cells is partitioned into a plurality of banks,
    wherein the PAR mask register comprises a plurality of bank mask bits, each bank mask bit corresponding to a bank and indicating whether a refresh is enabled or disabled for the corresponding bank, and
    wherein when the PAAR is enabled and the REF command is a refresh-per-bank command, the memory device is configured to skip the refreshing of a current bank when the corresponding bank mask bit indicates that the refresh is disabled.

8. The apparatus of claim 5,
    wherein the plurality of memory cells is partitioned into a plurality of banks, each bank comprising a plurality of segments,
    wherein the PAR mask register comprises a plurality of segment mask bits, each segment mask bit corresponding to a segment indicating whether a refresh is enabled or disabled for the corresponding segment, and
    wherein when the PAAR is enabled and the REF command is a refresh-all-banks command, the memory device is configured to, for each bank, skip refreshing of each segment whose corresponding segment mask bit indicates that the refresh is disabled.

9. The apparatus of claim 5,
wherein the plurality of memory cells is partitioned into a plurality of banks,
wherein the PAR mask register comprises a plurality of bank mask bits, each bank mask bit corresponding to a bank and indicating whether a refresh is enabled or disabled for the corresponding bank, and
wherein when the PAAR is enabled and the REF command is a refresh-all-banks command, the memory device is configured to skip the refreshing of each bank whose corresponding bank mask bit indicates that the refresh is disabled.

10. The apparatus of claim 5,
wherein the plurality of memory cells is partitioned into a plurality of banks, each bank comprising a plurality of segments,
wherein the PAR mask register includes a plurality of bank mask bits and a plurality of segment mask bits, each bank mask bit corresponding to a bank and indicating whether a refresh is enabled or disabled for the corresponding bank, and each segment mask bit corresponding to a segment and indicating whether a refresh is enabled or disabled for the corresponding segment, and
wherein when the memory device is in the self-refresh mode and the PASR is enabled, the memory device is configured to
skip refreshing of each bank whose corresponding bank mask bit indicates that the refresh is disabled for that bank, and
for each bank whose corresponding bank mask bit indicates that the refresh is enabled for that bank, skip refreshing each segment whose corresponding segment mask bit indicates that the refresh is disabled.

11. An apparatus, comprising:
a system-on-chip (SOC) configured to communicate with a memory device over a link,
wherein the memory device comprises:
a plurality of memory cells; and
a partial array refresh (PAR) mask register,
wherein the SOC is configured to instruct the memory device to enter into a self-refresh mode to cause the memory device to refresh a subset of the memory cells selected in accordance with the PAR mask register without receiving refresh (REF) commands from the SOC when a partial array self-refresh (PASR) is enabled, and
wherein the SOC is configured to issue the REF command to the memory device to cause the memory device to refresh the subset of the memory cells selected in accordance with the PAR mask register when a partial array auto-refresh (PAAR) is enabled.

12. The apparatus of claim 11, wherein the memory device comprises a plurality of mode registers (MR), the MR comprising the PAR mask register and a plurality of enable bits including a PASR enable bit and a PAAR enable bit, the PASR enable bit indicating whether the PASR is enabled or disabled, and the PAAR enable bit indicating whether the PAAR is enabled or disabled.

13. The apparatus of claim 12, wherein the SOC is configured to
issue a mode register write (MRW) command with a corresponding mode value of the PAAR enable bit to the memory device, and
for each mode register used to implement the PAR mask register, issue the MRW command with the corresponding mode value to the memory device so as to cause a mask value to be written to the PAR mask register, the mask value indicating a refresh skip region comprising one or more portions of the plurality of memory cells that do not require refreshing.

14. The apparatus of claim 13, wherein the SOC is configured to
receive the refresh skip region from a memory driver of a computing system, and
issue the MRW commands to set the PAAR enable bit and to set the mask value indicating the refresh skip region subsequent to receiving the refresh skip region from the memory driver.

15. The apparatus of claim 13, wherein the SOC is configured to adjust a duration in between issuing successive REF commands to the memory device based on the refresh skip region.

16. The apparatus of claim 11,
wherein the plurality of memory cells is partitioned into a plurality of banks, each bank comprising a plurality of segments,
wherein the PAR mask register comprises a plurality of segment mask bits, each segment mask bit corresponding to a segment indicating whether a refresh is enabled or disabled for the corresponding segment, and
wherein when the PAAR is enabled, the REF command issued by the SOC is a refresh-per-bank command to cause the memory device to skip refreshing of each segment whose corresponding segment mask bit indicates that the refresh is disabled.

17. The apparatus of claim 11,
wherein the plurality of memory cells is partitioned into a plurality of banks,
wherein the PAR mask register comprises a plurality of bank mask bits, each bank mask bit corresponding to a bank and indicating whether a refresh is enabled or disabled for the corresponding bank, and
wherein when the PAAR is enabled, the REF command issued by the SOC is a refresh-per-bank command to cause the memory device to skip the refreshing of a current bank when the corresponding bank mask bit indicates that the refresh is disabled.

18. The apparatus of claim 11,
wherein the plurality of memory cells is partitioned into a plurality of banks, each bank comprising a plurality of segments,
wherein the PAR mask register comprises a plurality of segment mask bits, each segment mask bit corresponding to a segment and indicating whether a refresh is enabled or disabled for the corresponding segment, and
wherein when the PAAR is enabled, the REF command issued by the SOC is a refresh-all-banks command to cause the memory device to, for each bank, skip refreshing of each segment whose corresponding segment mask bit indicates that the refresh is disabled.

19. The apparatus of claim 11,
wherein the plurality of memory cells is partitioned into a plurality of banks,
wherein the PAR mask register comprises a plurality of bank mask bits, each bank mask bit corresponding to a bank and indicating whether a refresh is enabled or disabled for the corresponding bank, and
wherein when the PAAR is enabled, the REF command issued by the SOC is a refresh-all-banks command to cause the memory device to skip the refreshing of each bank whose corresponding bank mask bit indicates that the refresh is disabled.

20. The apparatus of claim 11,
wherein the apparatus comprises a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and
wherein the device incorporates the memory device and the SoC configured to communicate with each other over the link.

21. A method for reducing memory power consumption in an apparatus of a computing system,
wherein the apparatus comprises a system-on-chip (SOC) and a memory device configured to communicate with each other over a link,
wherein the memory device comprises:
a plurality of memory cells; and
a plurality of mode registers (MR) comprising a PAR mask register, a partial array self-refresh (PASR) enable bit, and a partial array auto-refresh (PAAR) enable bit, the PASR enable bit indicating whether PASR is enabled or disabled, and the PAAR enable bit indicating whether PAAR is enabled or disabled, and
wherein the method comprises:
issuing, by the SOC, a mode register write (MRW) command with a corresponding mode value of the PAAR enable bit to the memory device;
issuing, by the SOC, for each mode register used to implement the PAR mask register, a mode register write (MRW) command with a corresponding mode value to the memory device so as to cause a mask value to be written to the PAR mask register, the mask value corresponding to a refresh skip region;
issuing, by the SOC, a REF command to the memory device; and
skipping, by the memory device, refreshing of the refresh skip region based on the PAR mask register when the REF command is issued by the SOC and the PAAR enable bit is set.

22. The method of claim 21,
wherein the plurality of memory cells is partitioned into a plurality of banks, each bank comprising a plurality of segments,
wherein the PAR mask register comprises a plurality of segment mask bits, each segment mask bit corresponding to a segment and indicating whether a refresh is enabled or disabled for the corresponding segment, and
wherein the skipping the refreshing comprises skipping the refreshing of each segment whose corresponding segment mask bit indicates that the refresh is disabled when the REF command is a refresh-per-bank command and the PAAR enable bit is set.

23. The method of claim 21,
wherein the plurality of memory cells is partitioned into a plurality of banks, each bank comprising a plurality of segments,
wherein the PAR mask register comprises a plurality of segment mask bits, each segment mask bit corresponding to a segment indicating whether a refresh is enabled or disabled for the corresponding segment, and wherein the skipping the refreshing comprises, for each bank, skipping the refreshing of each segment whose corresponding segment mask bit indicates that the refresh is disabled when the REF command is a refresh-all-banks command and the PAAR enable bit is set.

24. An apparatus, comprising:
a system-on-chip (SOC) and a memory device configured to communicate with each other over a link,
wherein the SOC is configured to provide commands to the memory device over the link,
wherein the memory device comprises:
a plurality of memory cells;
a partial array refresh (PAR) mask register; and
means for refreshing,
wherein the means for refreshing refreshes a subset of the memory cells selected in accordance with the PAR mask register without receiving refresh (REF) commands from the SOC when the memory device is in a self-refresh mode and a partial array self-refresh (PASR) is enabled, and
wherein the means for refreshing refreshes the subset of the memory cells selected in accordance with the PAR mask register upon receiving the REF command from the SOC when a partial array auto-refresh (PAAR) is enabled.

25. The apparatus of claim 24,
wherein the plurality of memory cells is partitioned into a plurality of banks, each bank comprising a plurality of segments,
wherein the PAR mask register comprises a plurality of segment mask bits, each segment mask bit corresponding to a segment indicating whether a refresh is enabled or disabled for the corresponding segment, and
wherein when the PAAR is enabled and the REF command is a refresh-per-bank command, the means for refreshing skips refreshing of each segment whose corresponding segment mask bit indicates that the refresh is disabled.

26. The apparatus of claim 24,
wherein the plurality of memory cells is partitioned into a plurality of banks, each bank comprising a plurality of segments,
wherein the PAR mask register comprises a plurality of segment mask bits, each segment mask bit corresponding to a segment indicating whether a refresh is enabled or disabled for the corresponding segment, and
wherein when the PAAR is enabled and the REF command is a refresh-all-banks command, the means for refreshing, for each bank, skips the refreshing of each segment whose corresponding segment mask bit indicates that the refresh is disabled.

27. An apparatus, comprising:
a system-on-chip (SOC) configured to communicate with a memory device over a link,
wherein the memory device comprises: and
a plurality of memory cells; and
a partial array refresh (PAR) mask register,
wherein the SOC is configured to issue a refresh (REF) command to the memory device over the link to cause the memory device to refresh a subset of the memory cells selected in accordance with the PAR mask register when a partial array auto-refresh (PAAR) is enabled on the memory device.

* * * * *